United States Patent
Chiu (10) Patent No.: US 11,224,142 B2
(45) Date of Patent: Jan. 11, 2022

(54) COOLING FAN MODULE HAVING FUNCTIONALITY OF BLOCKING REVERSE FLOW OF HOT AIR AND A HOST ELECTRONIC SYSTEM HAVING THE SAME

(71) Applicant: LANNER ELECTRONICS INC., New Taipei (TW)

(72) Inventor: Sheng-Han Chiu, New Taipei (TW)

(73) Assignee: LANNER ELECTRONICS INC., New Taipei (TW)

( * ) Notice: Subject to any disclaimer, the term of this patent is extended or adjusted under 35 U.S.C. 154(b) by 0 days.

(21) Appl. No.: 15/930,565

(22) Filed: May 13, 2020

(65) Prior Publication Data

US 2021/0321530 A1 Oct. 14, 2021

(30) Foreign Application Priority Data

Apr. 8, 2020 (TW) ................................. 109204040

(51) Int. Cl.
*H05K 7/20* (2006.01)
(52) U.S. Cl.
CPC ..... *H05K 7/20145* (2013.01); *H05K 7/20172* (2013.01)
(58) Field of Classification Search
CPC ........... H05K 7/20145; H05K 7/20172; H05K 7/20572; H05K 7/20136; H05K 1/0203; H01L 2924/0002; H01L 2924/00; H01L 23/467; F24F 11/79; F24F 1/24
USPC ........... 361/695, 694, 679.48, 679.49, 679.5, 361/679.51, 690, 691; 165/104.33, 80.2; 454/256, 265, 303, 333
See application file for complete search history.

(56) References Cited

U.S. PATENT DOCUMENTS

| 6,031,717 A * | 2/2000 | Baddour .................. G06F 1/20 361/679.48 |
| 10,935,148 B2 * | 3/2021 | Kie czykowski ..... F16K 15/035 |
| 2008/0151490 A1 * | 6/2008 | Fan .......................... G06F 1/20 361/679.47 |
| 2014/0273800 A1 * | 9/2014 | Carlyon .............. F24F 13/1426 454/259 |

* cited by examiner

*Primary Examiner* — Mandeep S Buttar (57) ABSTRACT

A cooling fan module includes a fan unit and an air flow blocking unit. The air flow blocking unit includes a left-side plate, a left-side support pole, a left-side air flow blocking plate, a right-side plate, a right-side support pole, a right-side air flow blocking plate, and a stop member. The left-side air flow blocking plate and the right-side air flow blocking plate are blown by an air flow flowing from outside environment into a case through the fan unit that is in a malfunction state, thereby rotating by respectively taking the left-side support pole and the left-side support pole as a rotary center thereof. Consequently, the left-side air flow blocking plate and the right-side air flow blocking plate are stopped rotating by the stop member, such that the air flow is blocked, by the two air flow blocking plates, from being entering the case.

5 Claims, 7 Drawing Sheets

COOLING FAN MODULE HAVING FUNCTIONALITY OF BLOCKING REVERSE FLOW OF HOT AIR AND A HOST ELECTRONIC SYSTEM HAVING THE SAME

BACKGROUND OF THE INVENTION

1. Field of the Invention

The present invention relates to the technology field of cooling fan, and more particularly to a cooling fan module having functionality of blocking reverse flow of hot air and a host electronic system equipped with the forgoing cooling fan.

2. Description of the Prior Art

Nowadays, computer system has become a necessary host electronic device for use in the fields of human life and industry. Conventionally-used computer systems include: desk computer, laptop computer, all-in-one computer, industrial computer, server computer, and video game console. In addition, it is known that each of the forgoing computer systems certainly equipped with at least one cooling fan, and the cooling fan is adopted for achieving a heat dissipation of electronic chips and/or modules that are accommodated in a computer case of the computer system. It is worth explaining that, owing to the fact that each of the high-technology applications of space exploration, petroleum exploration, meteorological observation, cloud computing, and video game streaming service has a high-performance requirement on computing speed of the computer system, the computer system is therefore designed to have a complex circuit structure consisting of at least one host electronic module and other necessary electronic chips and/or components. In such case, how to well develop a high efficiency heat dissipation module for use in the forgoing computer system having complex circuit structure hence becomes a very important issue.

Figure 1:
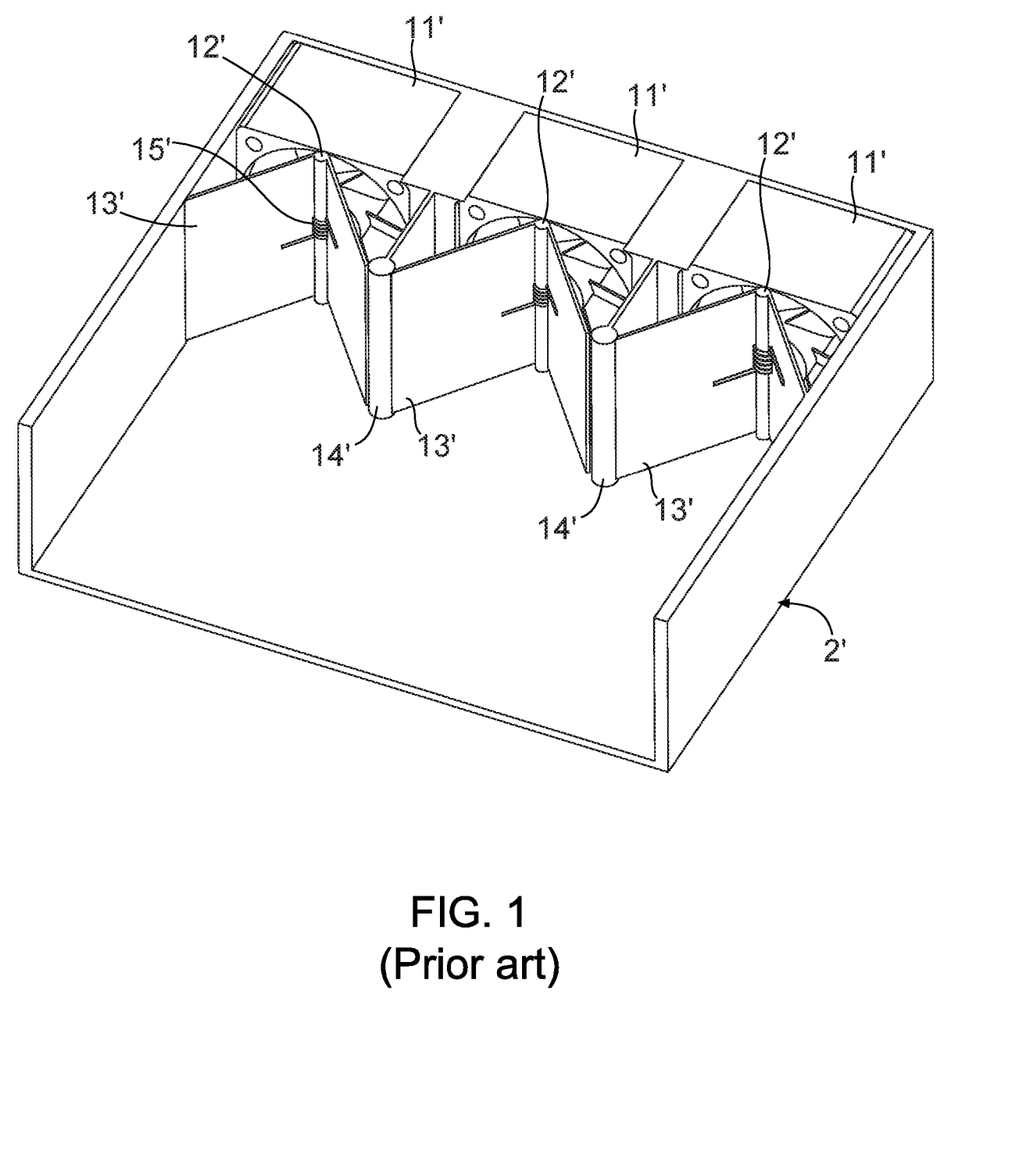
FIG. 1 shows a first stereo diagram of a wind direction limiting device that is disclosed by China patent publication No. CN101568249A.
Figure 2:
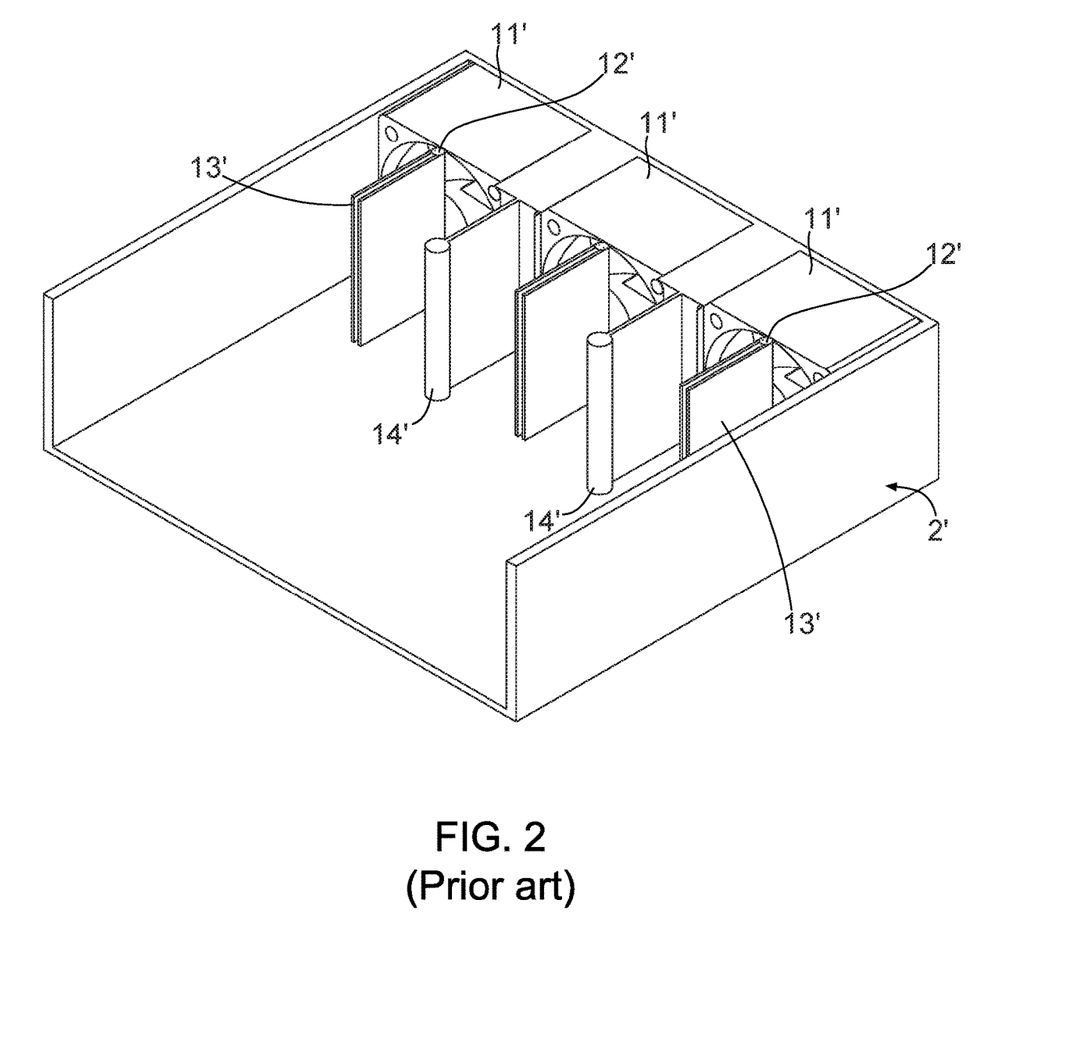
FIG. 2 shows a second stereo diagram of the wind direction limiting device.

In conventional, thermal design engineers commonly achieve the enhancement and/or efficiency of the heat dissipation of one specific computer system by disposing several cooling fans in the specific computer system's computer case simultaneously. However, in case of one of the several cooling fans failing to work normally, negative pressure effect would make the hot air exhausted out of the computer case by other normally-working cooling fans reversely flow into the computer case through the malfunction cooling fan. Accordingly, China patent publication No. CN101568249A discloses a wind direction limiting device for use in a cooling fan module that is applied in an electronic device. FIG. 1 and FIG. 2 respectively show a first stereo diagram and a second stereo diagram of the wind direction limiting device.

The cooling fan module consisting of N number of fan units 11' that are disposed in a computer case 2', and the wind direction limiting device comprises: N number of rotary rods 12', 2N number of blocking plates 13', and N−1 number of stop members 14'. In which, each of the N number of rotary rods 12' is disposed in the computer case 2', and is correspondingly adjacent to each of the N number of fan units 11'. From FIG. 1, it is understood that, each of the N number of rotary rods 12' is pivotally connected with two blocking plates 13'. In addition, each of the N number of rotary rods 12' is provided with a torsion spring 15' thereon, such that two legs of the torsion spring 15' respectively contact with the blocking plates 13', so as to utilize a torque of the torsion spring 15' to make the two blocking plates 13' be relatively opened by taking the rotary rod 12' as a rotary center. In such case, external air that flows through the malfunction cooling fan unit 11' is blocked by the two relatively-opened blocking plates 13', thereby failing to continuously flow into the computer case 2'. On the contrary, as FIG. 2 shows, when the cooling fan units 11' all work normally, hot air producing by electronic chips and/or components is exhausted out of the computer case 2' by the cooling fan units 11'. In the meantime, flow of the hot air (i.e., hot air flow) needs to overcome the torque of the torsion spring 15' in order to make the two blocking plates 13' be relatively closed by wind blowing, thereby making the hot air in the computer case 2' be successfully exhausted out.

After put the wind direction limiting device of China patent publication No. CN101568249A into practice for a long time, thermal design engineers have eventually found that the forgoing wind direction limiting device exhibits a main drawback in practical use. That is, the hot air flow is generated in case of the cooling fan unit(s) 11' works normally, and the hot air flow needs to overcome the torque of the torsion spring 15' for making the two blocking plates 13' be relatively closed by wind blowing, in order to make the hot air in the computer case 2' be successfully exhausted out.

From above descriptions, it is understood that there is still room for improvement in the conventional cooling fan(s). In view of that, inventors of the present application have made great efforts to make inventive research and eventually provided a cooling fan module having functionality of blocking reverse flow of hot air and a host system equipped with the forgoing cooling fan.

SUMMARY OF THE INVENTION

The primary objective of the present invention is to disclose a cooling fan module having functionality of blocking reverse flow of hot air. The cooling fan module having functionality of blocking reverse flow of hot air is for application in a case of a host electronic system, and consists of a fan unit and an air flow blocking unit. In which, the air flow blocking unit comprises a left-side plate, a left-side support pole, a left-side air flow blocking plate, a right-side plate, a right-side support pole, a right-side air flow blocking plate, and a stop member. By such arrangement, the left-side air flow blocking plate and the right-side air flow blocking plate are blown by an air flow that flows from outside environment into the case through the fan unit that is in a malfunction state, so as to rotate by respectively taking the left-side support pole and the left-side support pole as a rotary center thereof. Consequently, the left-side air flow blocking plate and the right-side air flow blocking plate are stopped rotating by the stop member, such that the air flow is blocked, by the two air flow blocking plates, from being entering the case.

It is worth further explaining that, the forgoing air flow blocking unit is particularly designed for making both the left-side air flow blocking plate and the right-side air flow blocking plate can be easily blown to rotate by the air flow that flows from outside environment into the case through the fan unit that is in a malfunction state, without using any auxiliary mechanism(s). Thus, the cooling fan module having functionality of blocking reverse flow of hot air proposed by the present invention includes several advantages of simple structure, easy to be applied in a computer system, and low wind resistance.

For achieving the primary objective of the present invention, an embodiment for the cooling fan module having functionality of blocking reverse flow of hot air is provided, comprising:
a fan unit adopted for being disposed in a case that accommodates s at least one electronic chips and at least one electronic components; and
an air flow blocking unit, being disposed near to a wind-inletting side of the fan unit, and comprising:
a left-side plate, being disposed near to the wind-inletting side of the fan unit, so as to face the wind-inletting side by one of two vertical sides thereof;
a left-side support pole, being connected to another one vertical side of the left-side plate;
a left-side air flow blocking plate, having at least one first pivotal connection portion, and being pivotally connected to the left-side support pole through the at least one first pivotal connection portion;
a right-side plate, being disposed near to the wind-inletting side of the fan unit, so as to face the wind-inletting side by one of two vertical sides thereof; wherein there is a first spacing distance between the right-side plate and the left-side plate, and the first spacing distance being smaller than or equal to a width of the fan unit;
a right-side support pole, being connected to another one vertical side of the right-side plate;
a right-side air flow blocking plate, having at least one second pivotal connection portion, and being pivotally connected to the right-side support pole through the at least one second pivotal connection portion; and
a stop member, being disposed at a center position between the right-side plate and the left-side plate; wherein there is a second spacing distance between the stop member and the fan unit, and the second spacing distance being smaller than or equal to a width of the left-side plate;
wherein in case of the fan unit working normally for driving a hot air that is generated by the at least one electronic chip and/or the at least one electronic component to flow out of the case through the fan unit, a first air flow being produced so as to blow the left-side air flow blocking plate and the right-side air flow blocking plate, thereby consequently making a first included angle be formed between the left-side plate and the left-side air flow blocking plate, and being formed the right-side plate and the right-side air flow blocking plate;
wherein when the fan unit fails to work normally or is in a malfunction state, a negative pressure effect makes an external air flow into the case through the fan unit, such that a second air flow is produced so as to blow the left-side air flow blocking plate and the right-side air flow blocking plate, thereby consequently making a second included angle be formed between the left-side plate and the left-side air flow blocking plate, and being formed the right-side plate and the right-side air flow blocking plate;
wherein the second included angle is greater than the first included angle.

Moreover, an embodiment for a host electronic system is also provided in the present invention, comprising a case, at least one electronic chip, and at least one electronic component; wherein it is characterized in that the host electronic system further comprises the forgoing cooling fan module having functionality of blocking reverse flow of hot air.

In one practicable embodiment, the forgoing host electronic system is selected from the group consisting of server computer, industrial computer, cloud computing system, video game console, desk computer, laptop computer, and all-in-one computer.

In one practicable embodiment, the forgoing air flow blocking unit further comprises:
a top plate, being connected to one of two horizontal sides of the left-side plate and one of two horizontal sides of the right-side plate by one surface thereof; and
a bottom plate, being connected to another one horizontal side of the left-side plate and another one horizontal side of the right-side plate by one surface thereof.

In one practicable embodiment, the forgoing air flow blocking unit further comprises:
a first extension plate, being connected to the left-side air flow blocking plate, wherein there is a bend angle between the first extension plate and the left-side air flow blocking plate; and
a second extension plate, being connected to the right-side air flow blocking plate, and wherein there is also the bend angle between the second extension plate and the right-side air flow blocking plate.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a cooling fan module having functionality of blocking reverse flow of hot air and a host system equipped with the forgoing cooling fan, embodiments of the present invention will be described in detail with reference to the attached drawings hereinafter.

Cooling Fan Module Having Functionality of Blocking Reverse Flow of Hot Air

Figure 3:
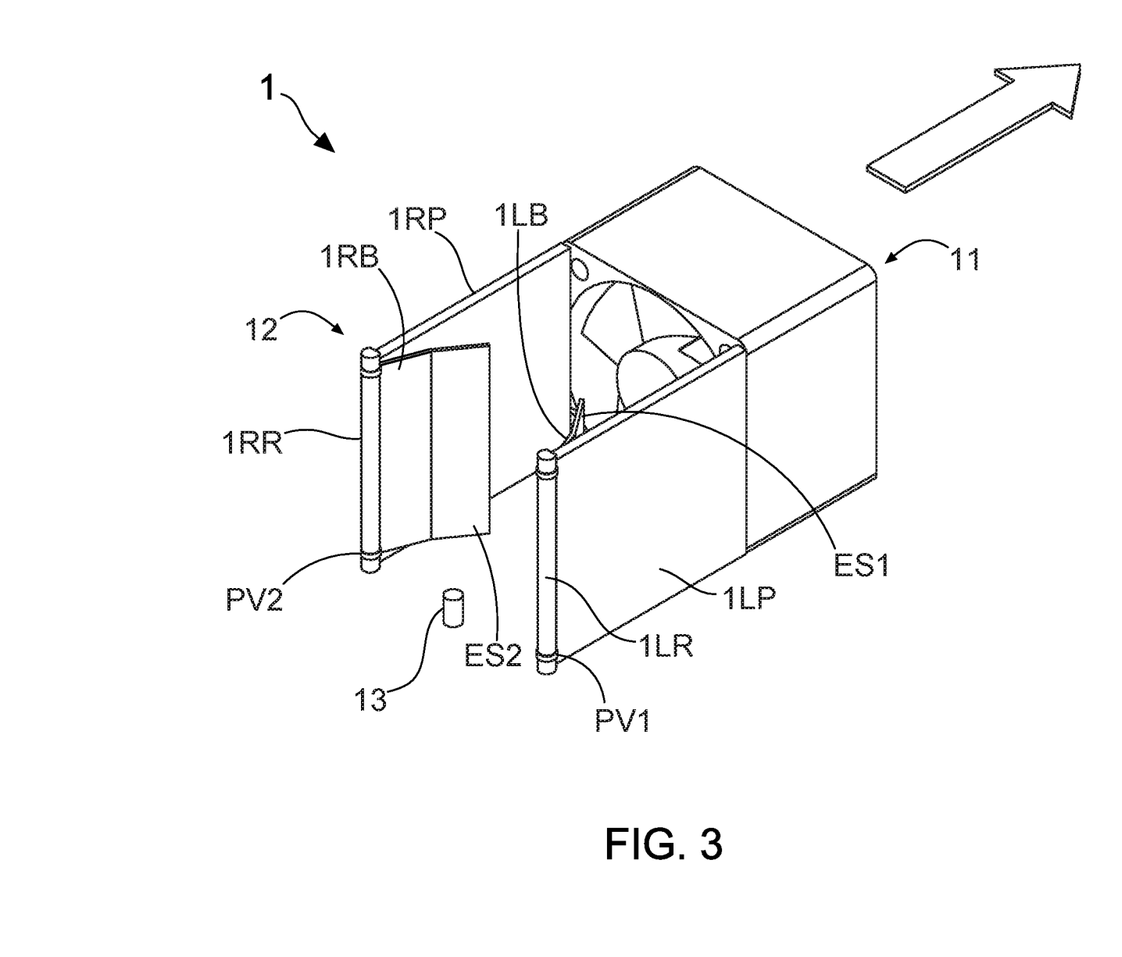
FIG. 3 shows a first stereo diagram of a cooling fan module having functionality of blocking reverse flow of hot air according to the present invention.
Figure 4:
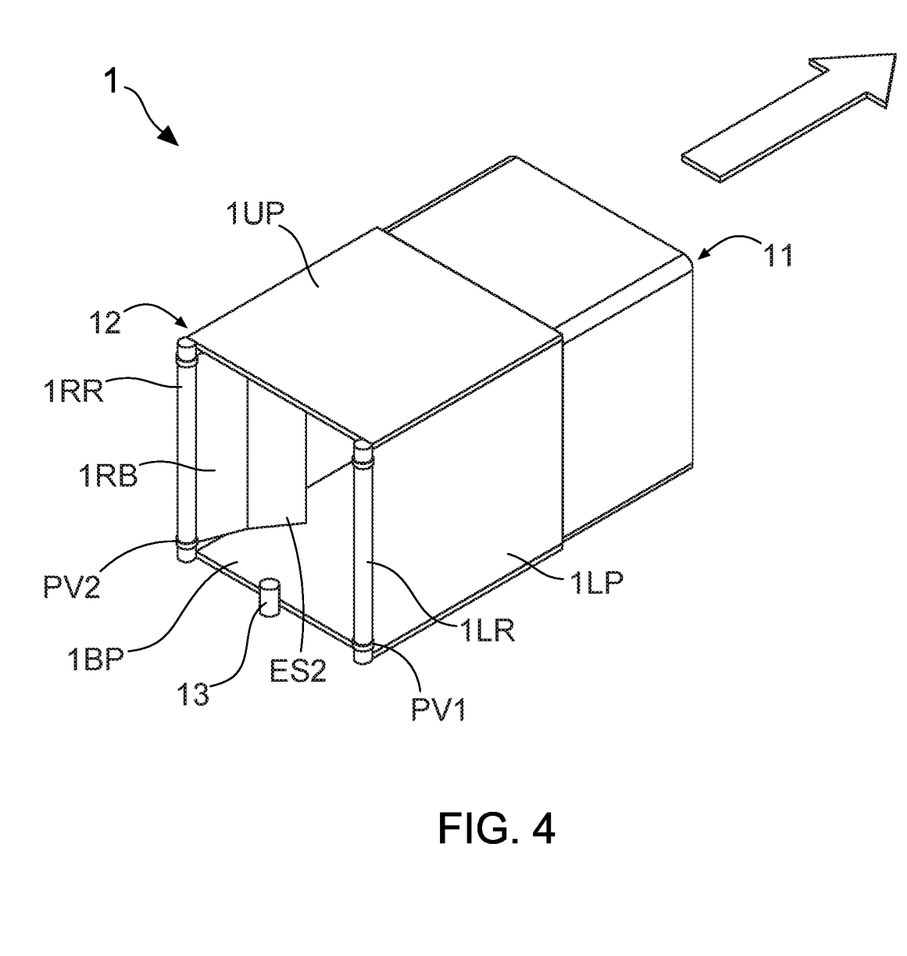
FIG. 4 shows a second stereo diagram of the cooling fan module having functionality of blocking reverse flow of hot air.

With reference to FIG. 3, there is shown a first stereo diagram of a cooling fan module having functionality of blocking reverse flow of hot air according to the present invention. Moreover, FIG. 4 shows a second stereo diagram of the cooling fan module having functionality of blocking reverse flow of hot air. According to the present invention, the cooling fan module 1 mainly comprises a fan unit 11 and an air flow blocking unit 12, wherein the fan unit 11 is adopted for being disposed in a case of a host electronic system that accommodates with at least one electronic chip and at least one electronic component. On the other hand, the air flow blocking unit 12 is disposed near to a wind-inletting side of the fan unit 11, and comprising: a left-side plate 1LP, a left-side support pole 1LR, a left-side air flow blocking plate 1LB, a right-side plate 1RP, a right-side support pole 1RR, a right-side air flow blocking plate 1RB, and a stop member 13.

It is worth explaining that, the fan unit 11 is disposed in the case of the host electronic system, and the forgoing "wind-inletting side" is a side of the fan unit 11 that faces the internal of the case. On the contrary, "wind-outletting side" is a side of the fan unit 11 that faces outside environment. As FIG. 3 shows, the left-side plate 1LP is disposed near to the wind-inletting side of the fan unit 11, so as to face the wind-inletting side by one of two vertical sides thereof. Moreover, the left-side support pole 1LR is connected to another one vertical side of the left-side plate 1LP, and the left-side air flow blocking plate 1LB has at least one first pivotal connection portion PV1, and is pivotally connected to the left-side support pole 1LR through the at least one first pivotal connection portion PV1.

FIG. 3 also depicts that the right-side plate 1RP is disposed near to the wind-inletting side of the fan unit 11, so as to face the wind-inletting side by one of two vertical sides thereof. In addition, there is a first spacing distance between the right-side plate 1RP and the left-side plate 1LP, and the first spacing distance is smaller than or equal to a width of the fan unit 11. On the other hand, the right-side support pole 1RR is connected to another one vertical side of the right-side plate 1RP. As FIG. 3 shows, the right-side air flow blocking plate 1RB has at least one second pivotal connection portion PV2, and is pivotally connected to the right-side support pole 1RR through the at least one second pivotal connection portion PV2. From FIG. 3, it is further understood that the stop member 13 is disposed at a center position between the right-side plate 1RP and the left-side plate 1LP. Moreover, there is a second spacing distance between the stop member 13 and the fan unit 11, and the second spacing distance is smaller than or equal to a width of the left-side plate 1LP.

As FIG. 4 shows, in one practicable embodiment, the air flow blocking unit 12 is designed to further comprise a top plate 1UP and a bottom plate 1BP. In which, the top plate 1UP is connected to one of two horizontal sides of the left-side plate 1LP and one of two horizontal sides of the right-side plate 1RP by one surface thereof. On the other hand, the bottom plate 1BP is connected to another one horizontal side of the left-side plate 1LP and another one horizontal side of the right-side plate 1RP by one surface thereof. Furthermore, FIG. 3 and FIG. 4 also show that the air flow blocking unit 12 further comprises a first extension plate ES1 and a second extension plate ES2. In which, the first extension plate ES1 is connected to the left-side air flow blocking plate 1LB, and there is a bend angle between the first extension plate ES1 and the left-side air flow blocking plate 1LB. On the other hand, the second extension plate ES2 is connected to the right-side air flow blocking plate 1RB, and there is also the bend angle between the second extension plate ES2 and the right-side air flow blocking plate 1RB. As explained in more detail below, the disposing of the first extension plate ES1 and the second extension plate ES2 is helpful for leading the air flow blocking unit 12 to exhibit a low wind resistance for the hot air flow that is produced during the normal operation of the fan unit 11, such that the heat dissipation efficiency of the fan unit 11 is therefore enhanced.

Figure 5:
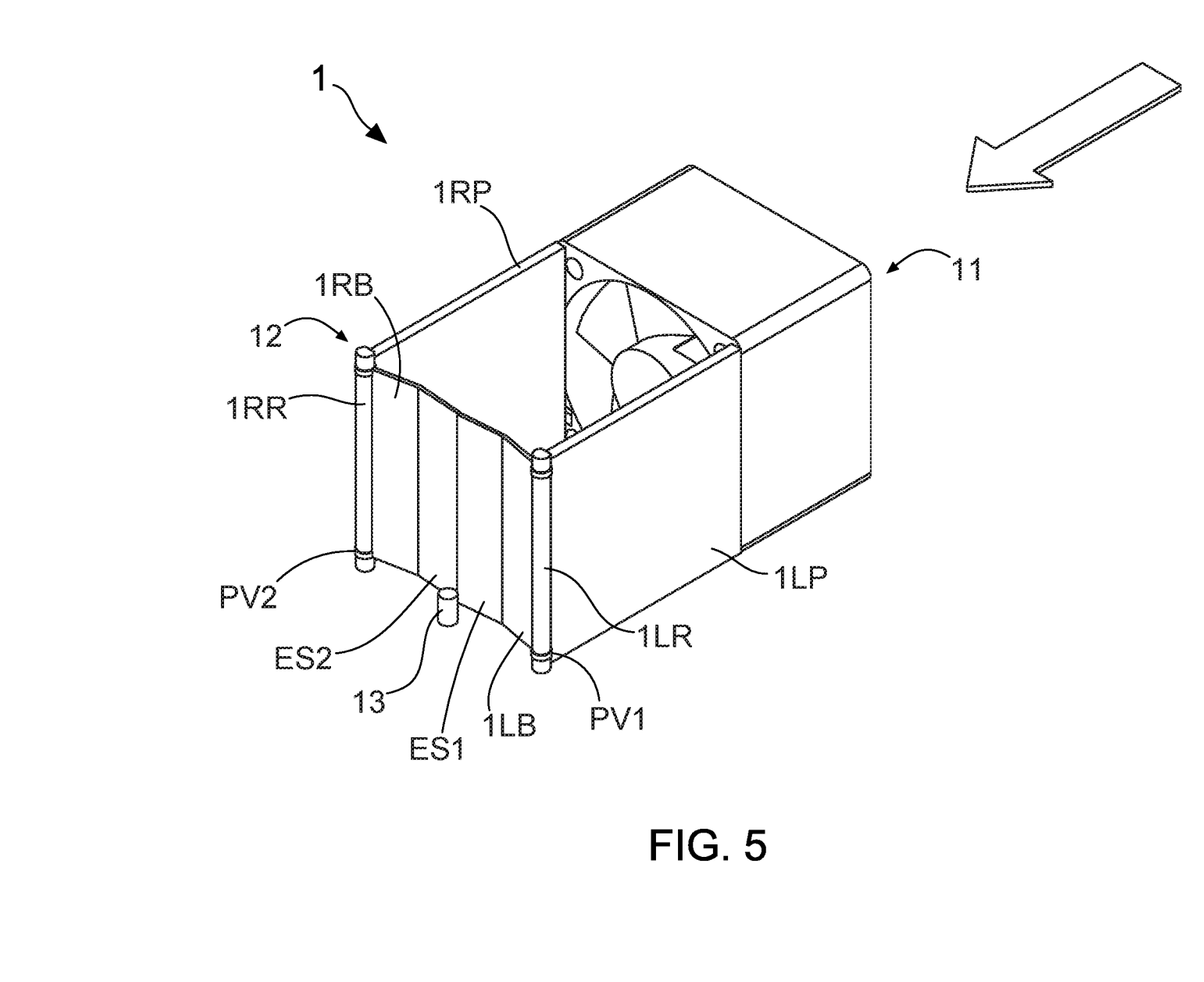
FIG. 5 shows a third stereo diagram of the cooling fan module having functionality of blocking reverse flow of hot air.

With reference to FIG. 3 again, and please simultaneously refer to FIG. 5, which shows a third stereo diagram of the cooling fan module having functionality of blocking reverse flow of hot air. In case of the fan unit 11 working normally for driving a hot air that is generated by the at least one electronic chip and/or the at least one electronic component to flow out of the case through the fan unit 11, a first air flow is produced so as to blow the left-side air flow blocking plate 1LB and the right-side air flow blocking plate 1RB, thereby consequently making a first included angle be formed between the left-side plate 1LP and the left-side air flow blocking plate 1LB, and be formed between the right-side plate 1RP and the right-side air flow blocking plate 1RB.

As FIG. 5 shows, when the fan unit 11 fails to work normally or is in a malfunction state, a negative pressure effect makes an external air flow into the case through the fan unit 11, such that a second air flow is produced so as to blow the left-side air flow blocking plate 1LB and the right-side air flow blocking plate 1RB, thereby consequently making a second included angle be formed between the left-side plate 1LP and the left-side air flow blocking plate 1LB, and be formed the right-side plate 1RP and the right-side air flow blocking plate 1RB. After comparing FIG. 5 with FIG. 3, it is easy to know that the second included angle is in a range between 60° and 90°, and the first included angle is in a range between 1° and 30°. In other words, the second included angle is greater than the first included angle.

Host Electronic System Having the Forgoing Cooling Fan Module

Figure 6:
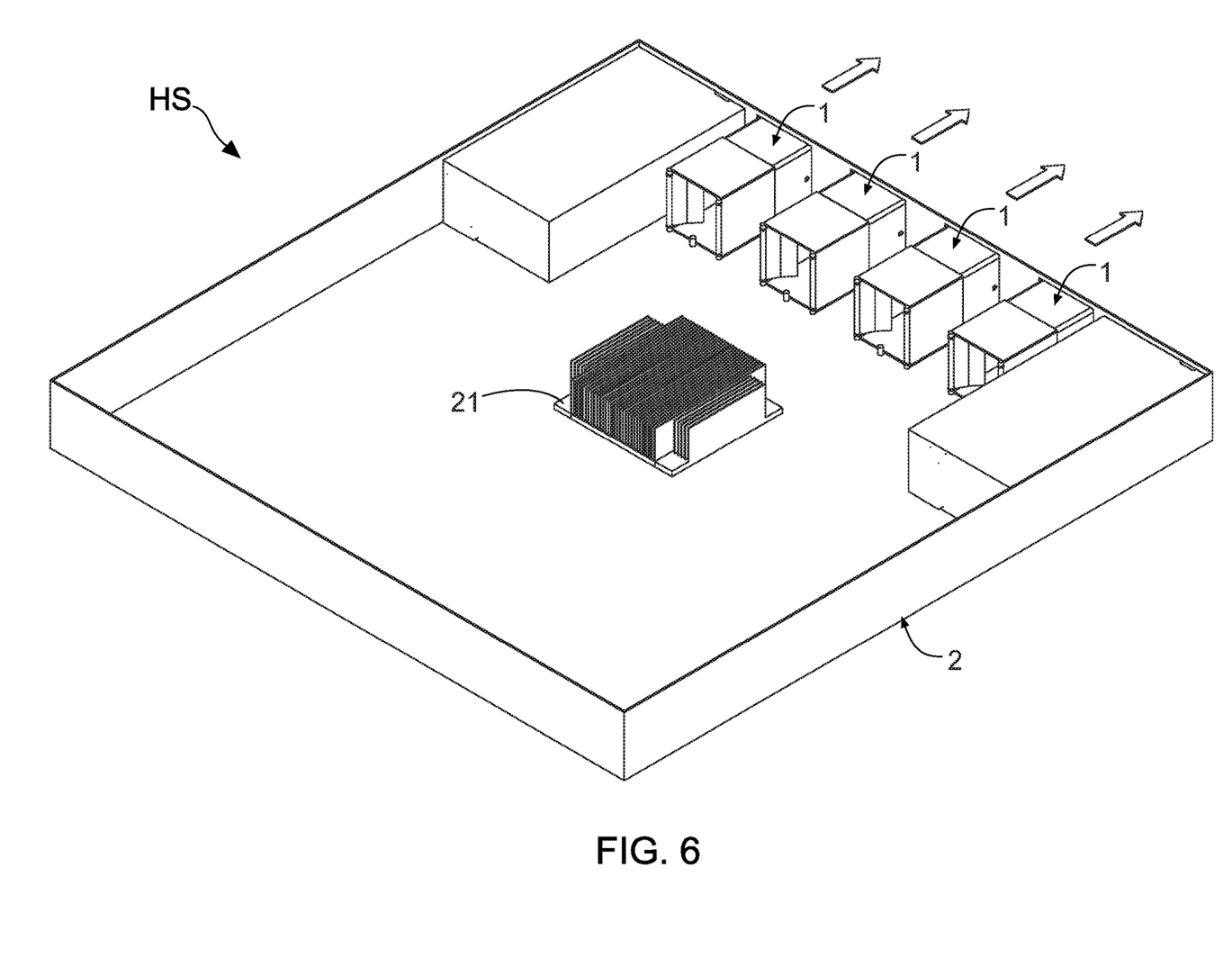
FIG. 6 shows a first stereo diagram of a host electronic system that is equipped with a plurality of cooling fan modules having functionality of blocking reverse flow of hot air.
Figure 7:
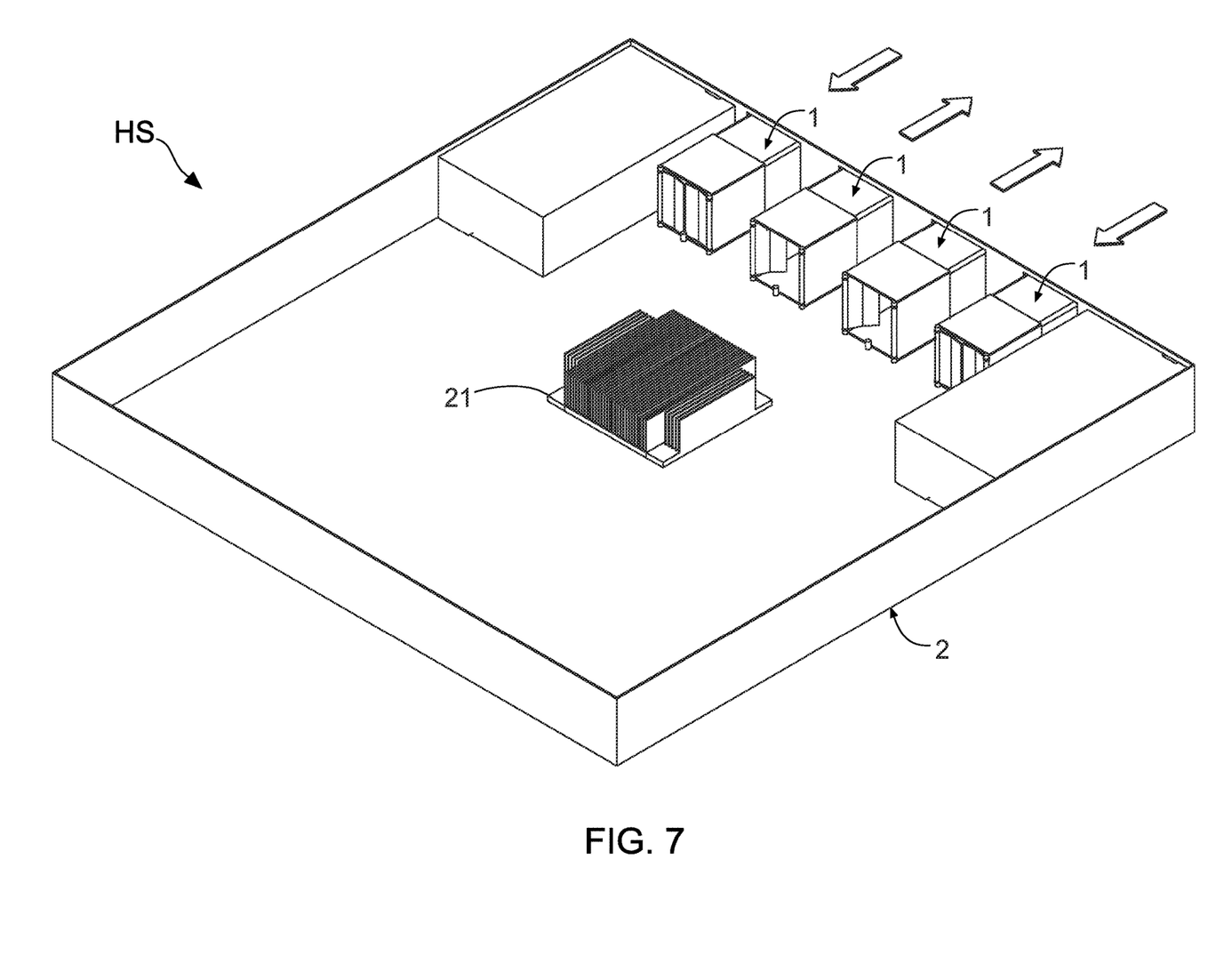
FIG. 7 shows a second stereo diagram of the host electronic system.

With reference to FIG. 6, there is shown a first stereo diagram of a host electronic system that is equipped with a plurality of the forgoing cooling fan modules having functionality of blocking reverse flow of hot air. Moreover, FIG. 7 shows a second stereo diagram of the host electronic system. From FIG. 6, it is understood that the host electronic system HS comprises: a case 2, at least one electronic chip 21 and at least one electronic component they are accommodated in the case 2, and several cooling fans modules 1. Because above descriptions have introduced the constituting members and the structure of the cooling fan module 1, that would not be repeatedly explained herein. Moreover, it is noted that the numeric symbols for the constituting members of the cooling fan module 1 are also not presented in both FIG. 6 and FIG. 7, such that the way for applying the several cooling fan modules 1 in the case 2 can be succinctly depicted by FIG. 6 and FIG. 7. In a practicable embodiment, the host electronic system HS can be a server computer, an industrial computer, a cloud computing system, a video game console, a desk computer, a laptop computer, or an all-in-one computer.

Therefore, through above descriptions, all embodiments and their constituting elements of the cooling fan module having functionality of blocking reverse flow of hot air proposed by the present invention have been introduced completely and clearly. The above description is made on embodiments of the present invention. However, the embodiments are not intended to limit scope of the present invention, and all equivalent implementations or alterations within the spirit of the present invention still fall within the scope of the present invention.

What is claimed is:

1. A cooling fan module having functionality of blocking reverse flow of hot air, being disposed in a case of a host electronic system, and comprising:

a fan unit adopted for being disposed in the case that accommodates with at least one electronic chip and at least one electronic component therein; and an air flow blocking unit, being disposed near to a wind-inletting side of the fan unit, and comprising:

a left-side plate, being disposed near to the wind-inletting side of the fan unit, so as to face to the wind-inletting side by one of two vertical sides thereof;

a left-side support pole, being connected to another one vertical side of the left-side plate;

a left-side air flow blocking plate, having at least one first pivotal connection portion, and being pivotally connected to the left-side support pole through the at least one first pivotal connection portion;

a first extension plate, being connected to the left-side air flow blocking plate, and there being a first bent portion connected between the left-side air flow blocking plate and the first extension plate; wherein the first bent portion is faced to an inner space of the case by a concave side thereof, and a length ratio of the left-side air flow blocking plate to the first extension plate being substantially 1:1;

a right-side plate, being disposed near to the wind-inletting side of the fan unit, so as to face to the wind-inletting side by one of two vertical sides thereof; wherein there is a first spacing distance between the right-side plate and the left-side plate, and the first spacing distance being smaller than or equal to a width of the fan unit;

a right-side support pole, being connected to another one vertical side of the right-side plate;

a right-side air flow blocking plate, having at least one second pivotal connection portion, and being pivotally connected to the right-side support pole through the at least one second pivotal connection portion;

a second extension plate, being connected to the right-side air flow blocking plate, and there being a second bent portion connected between the right-side air flow blocking plate and the second extension plate; wherein the second bent portion is also faced to the inner space of the case by a concave side thereof, and a length ratio of the right-side air flow blocking plate to the second extension plate being substantially 1:1; and a stop member, being disposed at a center position between the right-side plate and the left-side plate; wherein there is a second spacing distance between the stop member and the fan unit, and the second spacing distance being smaller than or equal to a width of the left-side plate;

wherein in case of the fan unit working normally for driving a hot air that is generated by the at least one electronic chip and/or the at least one electronic component to flow out of the case through the fan unit, a first air flow being produced so as to blow the first extension plate, the left-side air flow blocking plate, the second extension plate and the right-side air flow blocking plate, thereby consequently making a first included angle be formed between the left-side plate and the left-side air flow blocking plate, and being formed the right-side plate and the right-side air flow blocking plate;

wherein when the fan unit fails to work normally or is in a malfunction state, a negative pressure effect makes an external air flow into the case through the fan unit, such that a second air flow is produced so as to blow the first extension plate and the second extension plate, thereby consequently making a second included angle be formed between the left-side plate and the left-side air flow blocking plate, and being formed the right-side plate and the right-side air flow blocking plate;

wherein the second included angle is greater than the first included angle.

2. The cooling fan module of claim 1, wherein the air flow blocking unit further comprises:

a top plate, being connected to one of two horizontal sides of the left-side plate and one of two horizontal sides of the right-side plate by one surface thereof; and a bottom plate, being connected to another one horizontal side of the left-side plate and another one horizontal side of the right-side plate by one surface thereof.

3. A host electronic system comprising a case, at least one electronic chip, and at least one electronic component, characterized in that the host electronic system further comprises a cooling fan module having functionality of blocking reverse flow of hot air, comprising:

a fan unit adopted for being disposed in a case; and an air flow blocking unit, being disposed near to a wind-inletting side of the fan unit, and comprising:

a left-side plate, being disposed near to the wind-inletting side of the fan unit, so as to face the wind-inletting side by one of two vertical sides thereof;

a left-side support pole, being connected to another one vertical side of the left-side plate;

a left-side air flow blocking plate, having at least one first pivotal connection portion, and being pivotally connected to the left-side support pole through the at least one first pivotal connection portion;

a first extension plate, being connected to the left-side air flow blocking plate, and there being a first bent portion connected between the left-side air flow blocking plate and the first extension plate; wherein the first bent portion is faced to an inner space of the case by a concave side thereof, and a length ratio of the left-side air flow blocking plate to the first extension plate being substantially 1:1;

a right-side plate, being disposed near to the wind-inletting side of the fan unit, so as to face the wind-inletting side by one of two vertical sides thereof; wherein there is a first spacing distance between the right-side plate and the left-side plate, the first spacing distance being smaller than or equal to a width of the fan unit;

a right-side support pole, being connected to another one vertical side of the right-side plate;

a right-side air flow blocking plate, having at least one second pivotal connection portion, and being pivotally connected to the right-side support pole through the at least one second pivotal connection portion;

a second extension plate, being connected to the right-side air flow blocking plate, and there being a second bent portion connected between the right-side air flow blocking plate and the second extension plate; wherein the second bent portion is also faced to the inner space of the case by a concave side thereof, and a length ratio of the right-side air flow blocking plate to the second extension plate being substantially 1:1; and a stop member, being disposed at a center position between the right-side plate and the left-side plate; wherein there is a second spacing distance between the stop member and the fan unit, and the second spacing distance being smaller than or equal to a width of the left-side plate;

wherein in case of the fan unit working normally for driving a hot air that is generated by the at least one electronic chip and/or the at least one electronic component to flow out of the case through the fan unit, a first air flow being produced so as to blow the first extension plate, the left-side air flow blocking plate, the second extension plate, and the right-side air flow blocking plate, thereby consequently making a first included angle be formed between the left-side plate and the left-side air flow blocking plate, and being formed the right-side plate and the right-side air flow blocking plate;

wherein when the fan unit fails to work normally or is in a malfunction state, a negative pressure effect makes an external air flow into the case through the fan unit, such that a second air flow is produced so as to blow the first extension plate and the second extension plate, thereby consequently making a second included angle be formed between the left-side plate and the left-side air flow blocking plate, and being formed the right-side plate and the right-side air flow blocking plate;

wherein the second included angle is greater than the first included angle.

4. The host electronic system of claim 3, wherein the air flow blocking unit further comprises:

a top plate, being connected to one of two horizontal sides of the left-side plate and one of two horizontal sides of the right-side plate by one surface thereof; and a bottom plate, being connected to another one horizontal side of the left-side plate and another one horizontal side of the right-side plate by one surface thereof.

5. The host electronic system of claim 3, wherein the host electronic system is selected from the group consisting of server computer, industrial computer, cloud computing system, video game console, desk computer, laptop computer, and all-in-one computer.

* * * * *